United States Patent [19]

Ihira et al.

[11] 4,445,224
[45] Apr. 24, 1984

[54] PULL-IN CIRCUIT FOR A DIGITAL PHASE LOCKED LOOP

[75] Inventors: Kuninosuke Ihira, Kawasaki; Shigeyuki Unagami, Zama; Takashi Kaku, Kawasaki, all of Japan

[73] Assignee: Fujitsu Limited, Kawasaki, Japan

[21] Appl. No.: 327,730

[22] Filed: Dec. 4, 1981

[30] Foreign Application Priority Data

Dec. 9, 1980 [JP] Japan ................................ 55-172672

[51] Int. Cl.³ ............................................... H03L 7/06
[52] U.S. Cl. .................................... 375/120; 307/516; 328/133
[58] Field of Search ..................... 307/269, 511, 516; 328/133; 329/122, 124; 331/1 A; 375/120

[56] References Cited

U.S. PATENT DOCUMENTS 4,338,574  7/1982  Fujita et al. ...................... 331/1 A
4,339,731  7/1982  Adams .............................. 307/516
4,355,284 10/1982  Acker .............................. 307/511

Primary Examiner—Benedict V. Safourek

[57] ABSTRACT

The present invention relates to a digital phase locked loop circuit, particularly to a circuit which realizes accurately digital phase locked loop pull-in operation at a high speed with a simplified circuit structure.

In the present invention, in order to obtain a phase difference between a single frequency signal and the digital phase locked loop clock signal which is obtained by dividing a specified frequency signal with a dividing counter, the phase difference is obtained in accordance with the signs, absolute values and amplitude ratio of two adjacent sample values. The sample values of said single frequency signal are taken at two points based on said digital phase locked loop clock signal corresponding to a phase difference of $\pi/2$ radians of said single frequency signal. A fast pull-in of the digital phase locked loop is realized by setting a value corresponding to the obtained phase difference into a dividing counter.

12 Claims, 12 Drawing Figures

$y_1 > 0, y_0 < 0$ $y_1 > 0, y_0 > 0$ $y_1 < 0, y_0 > 0$ $y_1 < 0, y_0 < 0$ $|y_1| < |y_0|$ $|y_1| > |y_0|$

PULL-IN CIRCUIT FOR A DIGITAL PHASE LOCKED LOOP

BACKGROUND OF THE INVENTION (1) Field of the Invention

The present invention relates to a digital phase locked loop to be used for the data modems, etc., and particularly to a circuit which synchronizes the phase of digital phase locked loop clock to a single frequency signal which is extracted from the received signal at a high speed and has a simplified circuit structure.

(2) Description of the Prior Art

In a high speed data communication system, it is necessary to carry out a timing pull-in sequence for synchronizing a digital phase locked loop to the phases of a received signal in order to get the correct data at the receiver. The digital phase locked loop itself is used in the prior art for such phase synchronization. Generally, the digital phase locked loop synchronizes the phase of the received signal by changing the frequency derived from a high frequency oscillator in the receiver. However, such a phase locked loop circuit requires a comparatively long period for phase synchronization and thus, it is not easy to realize the phase synchronization within a short period of time.

For many years, it has been necessary to curtail the pull-in time for phase synchronization and a method to meet such requirement is proposed in the U.S. Pat. No. 3,962,637. In this method the following process is performed. The phase error $\phi$ is obtained from the relation, $\phi = 1 - (1/45°) \cdot \tan(YQ_1/YQ_0)$ by using two adjacent demodulated samples ($YQ_0$, $YQ_1$), and synchronization is established by controlling such phase error $\phi$ by making it zero. However, the method of the prior art has a disadvantage in that the scale of a conversion table which performs conversion between the phase error $\phi$ and $1 - (1/45°) \cdot \tan^{-1}(YQ_1/YQ_0)$ is large. This is because the sample values $YQ_0$ and $YQ_1$ might be able to take zero as well as finite values, where the range of the ratio of sample values $|YQ_1/YQ_0|$ can vary from 0 to infinity ($\infty$) and as a result the value of $\tan^{-1}|YQ_1/YQ_0|$ can vary from 0 to infinity ($\infty$), thus a large scale conversion table must be prepared. An attempt to realize a small scale conversion table requires a complicated control system.

SUMMARY OF THE INVENTION

It is an object of the present invention to provide a system which eliminates disadvantages of such existing systems, detects a phase difference using a conversion table having a simplified structure and thereby realizes high speed phase synchronization.

It is another object of the present invention to provide an accurate synchronization for a pull-in sequence, and apply this to a general modem.

In order to realize such objects, the present invention discloses a high speed digital phase locked loop pull-in circuit which obtains a phase difference between a single frequency signal and the output signal of the digital phase locked loop by dividing a specified frequency. The invention includes a sample circuit which obtains the sample values of said single frequency signal at the two points based said output signal of the digital phase locked loop corresponding to a phase difference between $\pi/2$ of said single frequency signal samples. Also included are a comparator circuit which compares the absolute values of said two sampled values and an amplitude ratio circuit which obtains amplitude ratio of the two sample values. Further included are a conversion table for obtaining a value corresponding to said phase difference based on the sign bits of said two sample values, the output of said comparator circuit and the output of said amplitude ratio circuit, and an initial count value for a dividing counter is set by loaded from the output of said conversion table.

Further, the present invention discloses a high speed digital phase locked loop pull-in circuit which obtains a phase difference between the single frequency signals and the output signal of the digital phase locked loop by dividing the specified frequency signal. The invention includes a sample circuit which samples said single frequency signal at the two points based said output signal of the digital phase locked loop corresponding to a phase difference of $\pi/2$ radians between samples, and a magnitude comparator circuit which compares the absolute values of said two sample values, a amplitude ratio circuit which obtains an amplitude ratio of said two sample values. The invention also includes a conversion table which obtains a value corresponding to a supplementary angle of said phase difference from the sign bits of said two sample values, the output of said comparator circuit and the output of said amplitude ratio circuit, and a dividing counter which stops it's operation for a time period corresponding to said supplementary angle based on the output produced said conversion table.

Still further, said comparator circuit of the present invention comprises absolute value networks which take respective absolute values of said two sample values and a substractor which obtains a difference between two outputs of said absolute networks.

Moreover, said amplitude ratio circuit of the present invention comprises a selection circuit which selectively connects the two outputs of said two absolute value networks to a 1st or a 2nd paths. The 1st path being connected to a reciprocal network and the second path to a multiplier. The selection circuit is controlled by the output of said subtractor.

Furthermore, the present invention also comprises a phase detector which inputs both said output signal of the digital phase locked loop and one of said sample values signal and detects a phase difference between them, and a remove tooth network which thin or removes output pulses from pulses produced by an oscillator, which outputs said specified frequency signal, based on an output of said phase detector.

Additionally, the present invention also comprise a down counter which counts down a value corresponding to said supplementary angle, a 1st gate which opens when the value of said down counter becomes zero and connect "a" to the dividing counter to said oscillator and a 2nd gate which opens when the count value of said dividing counter becomes zero and which is controlled by a sequencer.

BRIEF DESCRIPTION OF THE DRAWINGS

FIG. 4 to FIG. 8 explain the basic principles of the present invention. Where.

FIG. 5 illustrates a relationship between sample values and the phase angle $\phi$ on the phase plane.

FIG. 8 illustrates a positional relationship of $y_1$ on the phase plane depending on the sign of the sample value $y_0$ and $y_1$ and the difference between their absolute values.

DETAILED DESCRIPTION OF THE PREFERRED EMBODIMENTS

Figure 1:
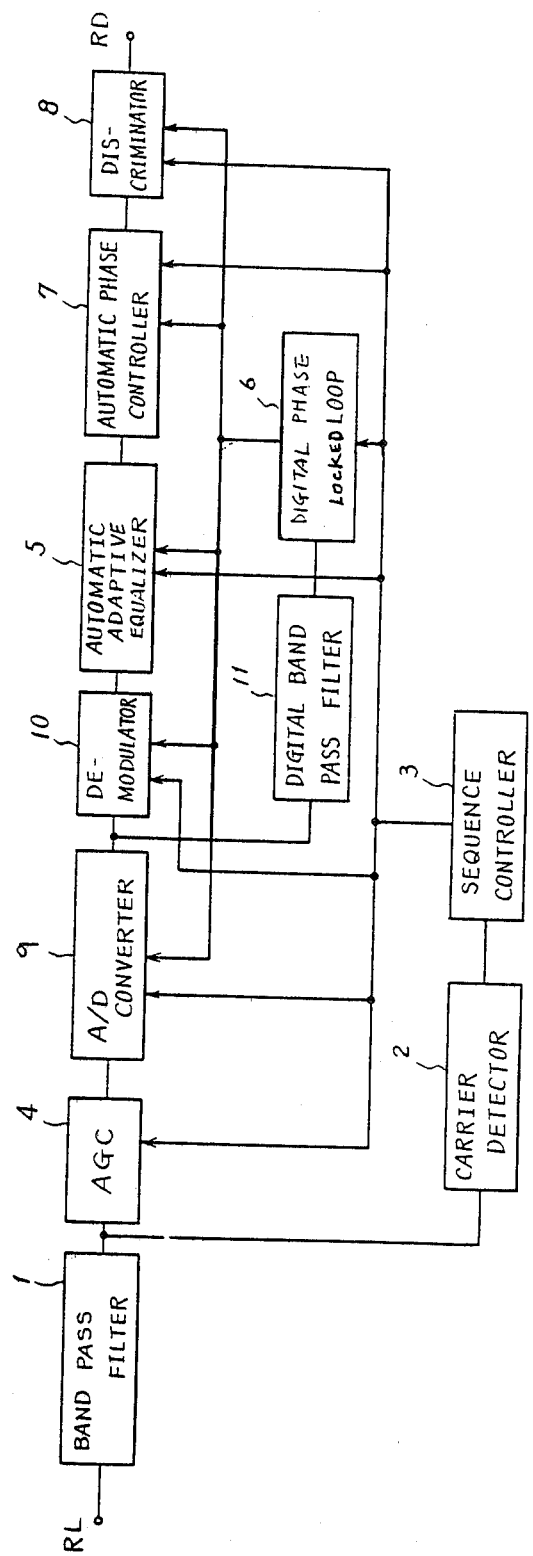
FIG. 1 is the block diagram of a modem receiver used for explaining one of the objects of the present invention.

FIG. 1 is a block diagram of a data modem receiver including the present invention.

In FIG. 1, 1 is a band pass filter; 2 is a carrier detector; 3 is a sequence controller; 4 is a automatic gain controller (AGC); 5 is an automatic adaptive equalizer; 6 is a digital phase locked loop; 7 is a automatic phase controller; 8 is a discriminator; 9 is a analog to digital converter; 10 is a demodulator; 11 is a digital band pass filter; RL is an input terminal; and RD is an output terminal.

The present invention relates to the digital phase locked loop 6.

In order to explain the background of the present invention, the operation of data modem shown in FIG. 1 is outlined below.

In the case of the data modem shown in FIG. 1, the input received signal is a modulated analog signal. This analog signal has been sent from the transmitter as a phase modulated signal containing phase information through a process in which a digital signal of several bits corresponds to a specified phase of the analog signal on the phase plane and is thus phase-modulated by said digital signal.

The phase modulated signal sent through the transmission line is received by the terminal RL, the outband signal components are eliminated by the band pass filter and a carrier higher than a constant amplitude ($-26$ dBm for example) is detected by the carrier detector 2. The sequence controller 3 is started when the carrier is detected. This sequence controller 3 controls the automatic gain controller 4, automatic adaptive equalizer 5, phase locked loop 6, automatic phase controller 7 and discriminator 8 at a constant symbol interval period.

Meanwhile, an output of the band pass filter 1 is amplified up to a constant average level by the automatic gain controller 4, then converted to a digital signal by the analog to digital converter 9 and the demodulated by the demodulator 10. This demodulated signal includes distortion due to the transmission line and also a phase deviation with respect to the carrier signal. Therefore, such distortion is compensated for by the automatic adaptive equalizer 5 and the phase deviation is compensated for by the automatic phase controller 7. Thus the digital signal is converted to the same as the original transmitted digital signal by the discriminator 8 and output at the received signal output terminal RD.

The reference timing for such processing is supplied respectively to the analog to digital converter 9, demodulator 10, automatic adaptive equalizer 5, automatic phase controller 7 and discriminator 8 etc. by the digital phase locked loop 6.

In order to correctly receive the phase modulated signal, the receiver requires phase synchronization between the input received signal and the reference timing signal.

For this purpose, a single frequency signal is extracted from the input receiving signal via a narrow band pass filter and then phase synchronization between this single frequency signal and the reference timing signal in the receiver is carried out. Thereby, phase synchronization between the input received signal and reference timing signal is established.

The present invention relates to the phase locked loop 6 for establishing phase synchronization between the input received signal and reference timing signal in the receiver as explained above.

Figure 2:
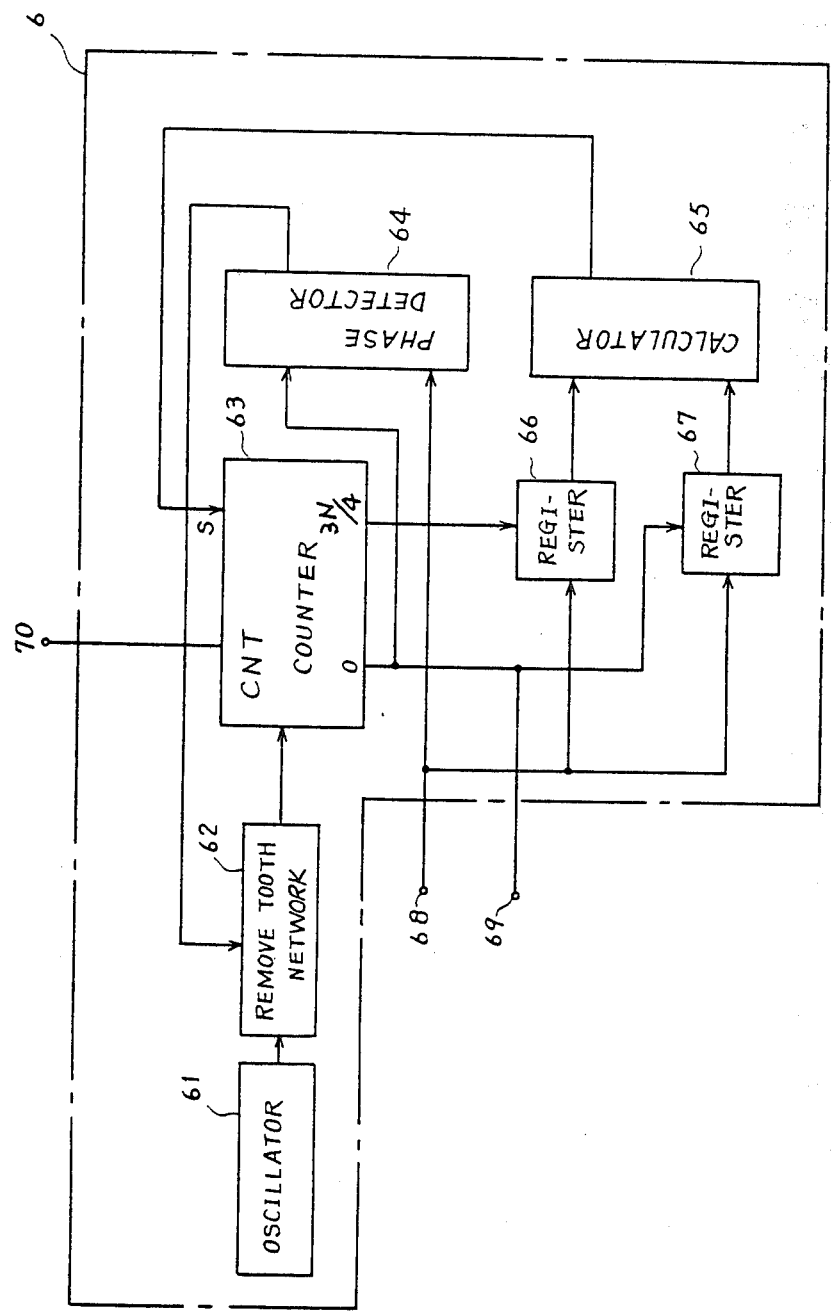
FIG. 2 illustrates an embodiment of the present invention.

FIG. 2 indicates an embodiment of the present invention. In this figure, 6 is the digital phase locked loop; 61 is an oscillator; 62 is a remove tooth network; 63 is a counter; 64 is a phase detector; 65 is a calculator; 66 and 67 are registers; 68 is an input terminal connected to the digital band pass filter 11 shown in FIG. 1; 69 is an output terminal of the phase locked loop 6; and 70 is the input terminal connected to the sequence controller 3 of FIG. 1.

A high frequency signal is output from the oscillator 61 and this output is divided or counted by the counter 63 and output from the output terminal 69 as the output reference timing signal CL of the digital phase locked loop (6). The start signal for pull-in of digital phase locked loop is input from the sequence controller 3 to counter 63 through the terminal 70.

Meanwhile, the single frequency signal $f_R$ extracted from the received signal is input through the input terminal 68 and passed to the phase detector 64. Thereby the phase comparison between the signal $f_R$ and the output signal CL of the digital phase locked loop (6) which is an output of the counter 63, is performed and phase difference information is input as an inhibit signal to the remove tooth network 62. As a result, the pulse train output of the oscillator 61 is thinned or the number pulses produced is reduced or pulse production is inhibited in accordance with the phase difference information and a phase pull-in is carried out. In this embodiment, the frequency of oscillator 61 is 614.5 kHz, frequency division ratio N is 256, and $f_R$ is 2400 Hz.

The above-described operations are known and disclosed for example in J. R. Cessna and D. M. Levy: "Phase Noise and Transient Times for a Binary Quantized Digital Phase-Locked Loop in White Gaussian Noise" IEEE Trans. COM-20, 2, P94 (April 1972); Proc. IEEE Vol. 69 No. 4, P401 to 431 "A Survey of Digital Phase-Locked Loops", and IEEE transactions communication Vol. 28 No. 8 P1197 to 1294 "Digital PCM Bit Synchronizer and Detector".

The present invention includes the resisters 66 and 67; calculator 65 and initial setting terminals of the counter 63 provided in order to pull in the initial phase at the first input point of the received signal.

The signal input at the input terminal 68 is obtained by digitizing the received signal with the analog to digital converter 9 and corresponds to a sample value of the single frequency signal $f_R$ which is extracted via the digital band pass filter 11. The frequency of signal $f_R$ is equivalent to that of the symbol rate of said phase modulated signal.

This sample value is input into the registers 66 and 67, and thus, input to the calculator 65. Thereby, the initial setting of the counter 63 for phase locking is carried out by obtaining the initial set value for the counter 63 from the sign bits of the sample value and the comparison of absolute values and the phase synchronization is carried out based on this sample value. An embodiment of the structure of the calculator 65 is shown in FIG. 3, and the basic principles of the present invention will be explained first by referring to FIGS. 4 to 8 in order to make it easy to understand the present invention, prior to a detailed explanation of operation of FIG. 3.

Figure 3:
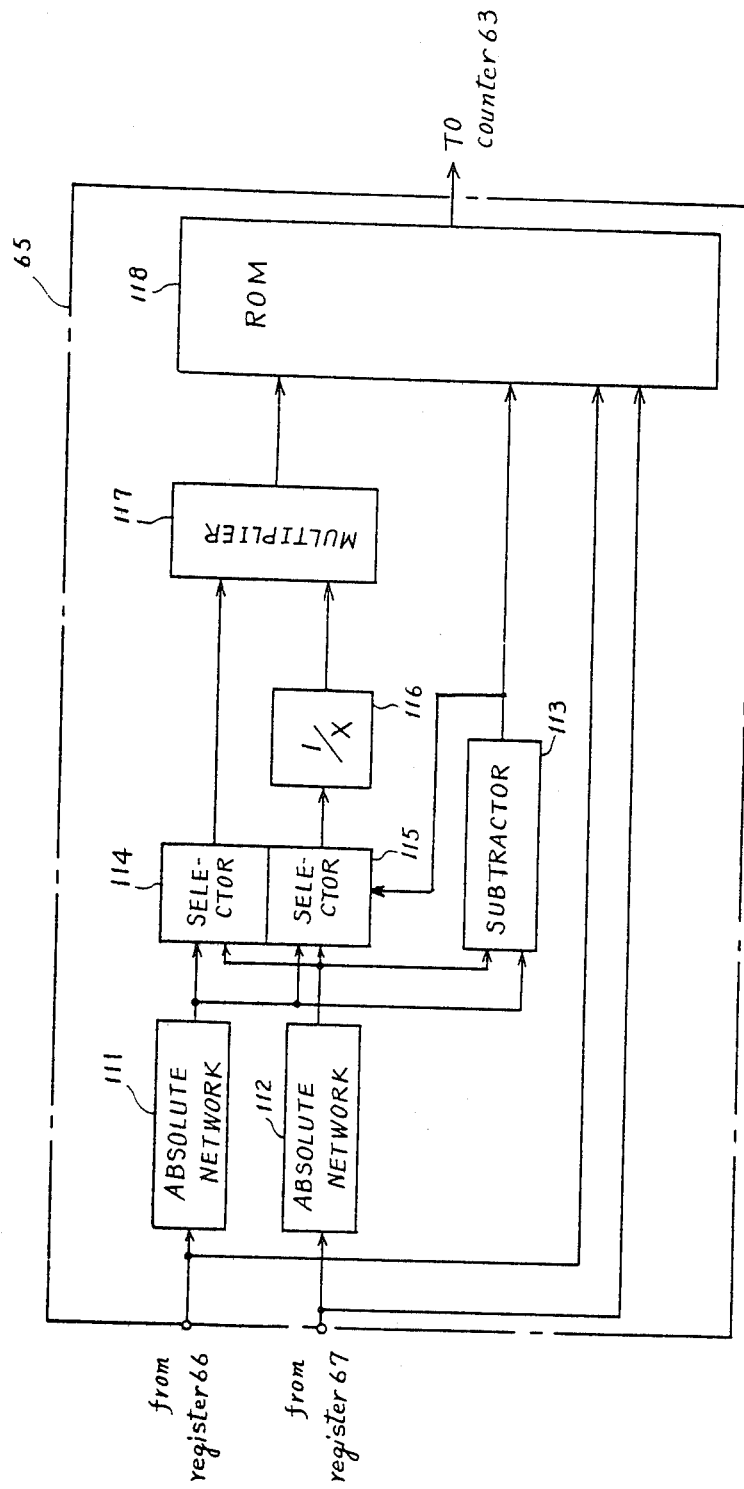
FIG. 3 illustrates an example of structure of the calculator 65 illustrated in FIG. 2.
Figure 4A:
FIG. 4(a) illustrates an output signal for the digital phase locked loop, FIG. 4(a)' illustrates a sampling clock signal $f_S$.
Figure 4A:
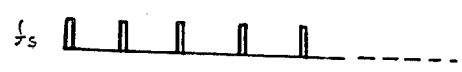
Figure 4B:
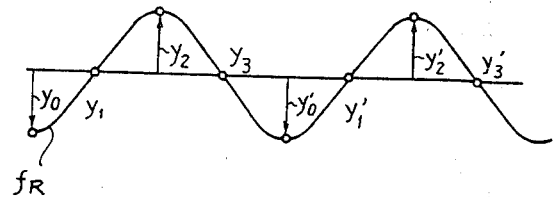
FIG. 4(b) illustrates a phase locked condition.
Figure 4C:
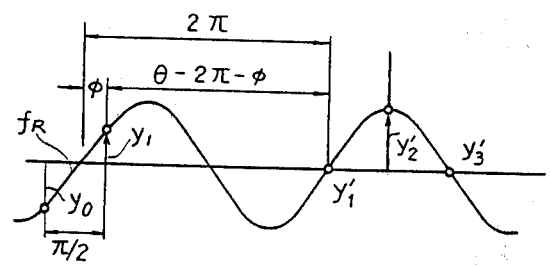
FIG. 4(c) illustrates a condition where the phases are not synchronized and a phase difference $\phi$ exists.

FIG. 4(a) is the output signal CL of the digital phase locked loop (6) obtained from the terminal 69 shown in FIG. 3, FIG. 4(a)' is the sampling clock $f_S$, while FIG. 4(b) and FIG. 4(c) respectively show the conditions where the phase synchronization with the single frequency signal $f_R$ is accomplished or a phase difference exists between them.

In this figure, $y_0$, $y_1$, $y_2$, ... are sample values of the single frequency signal $f_R$ at the output points of the output signal CL of digital phase locked loop 6.

Here the sampling frequency $f_S$ for signal $f_R$ is 4-times the frequency of output signal CL. Such frequency relationship allows the sampling frequency to be output with every phase difference of $\pi/2$ of the signal $f_R$. Therefore, with respect to the phase interval between the sample values $y_0$ and $y_1$, $y_0$ is ahead by $\pi/2$ radian.

Now suppose that the signal $f_R$ of FIG. 4(b) is phased locked with the output signal CL of digital phase locked loop 6. At this time, the timing of the zero-cross of signal $f_R$ matches the timings of sample values $y_1$, $y_3$, $y_1'$. Therefore, the values of sample values $y_1$, $y_3$, $y_1'$ are all zero. FIG. 4(c) shows the condition that the signal $f_R$ is unsynchronized, allowing a phase difference $\phi$ to exist. Since a criterion of phase matching is selected according to the zero-cross point where the signal $f_R$ shifts to the plus sign from the minus sign, a phase difference $\phi$ extends from the zero-cross point to the timing of sample value $y_1$.

Figure 5:
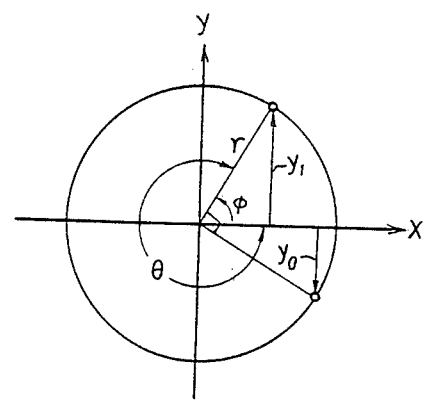

As shown in FIG. 4(c), the relationship between the sample values $y_0$ and $y_1$ can be indicated on the phase plane as shown in FIG. 5.

In FIG. 5, the relationship between sampled values and phase angle $\phi$ is indicated by the rotating vector of radius r. The relationship between the sampled values $y_1$ and $y_0$ and the phase angle $\phi$ is respectively expressed by equation (1) and (2).

$$y_1 = r \sin \phi \quad (1)$$

$$y_0 = r \sin(\phi - \pi/2) = -r \cos \phi \quad (2)$$

Equation (3) below can be obtained by dividing equation (1) and (2).

$$y_1/y_0 = -\tan \phi$$

Therefore, a phase angle $\phi$ is expressed by the following equation (4).

$$\phi = \tan^{-1}(-y_1/y_0) \quad (4)$$

Here, since a value of $\tan^{-1}(-y_1/y_0)$ is obtained from the equation (4), a phase difference $\phi$ corresponding to it is also obtained. As the circuit structure for obtaining $\phi$, a conversion table using a ROM etc. is usually employed, and the desired $\phi$ can be obtained by outputting an output corresponding to $\tan^{-1}(-y_1/y_0)$.

This value $\phi$ corresponds to a phase difference $\phi$ explained for FIG. 4(c).

Here, the conversion table provides an output corresponding to an input value in the relation of 1:1, corresponding to the specified input. According to the above example, when a ratio of sample values $y_0$ and $y_1$ is input, a corresponding value $\phi$ is output. For the conversion table, the ROM (Read Only Memory) is usually used as of the circuit structure, and outputs corresponding to respective addresses are previously prepared for the specified address and the outputs corresponding to the designated addresses are thus provided. In the case of above example, a ratio of above sample values $y_0$ and $y_1$ corresponds to the address.

Figure 6A:
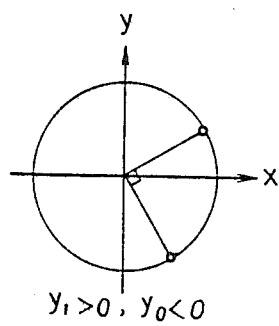
FIGS. 6(a)-6(d) illustrate the positions of $y_0$ and $y_1$ on the phase plane depending on their signs.
Figure 6B:
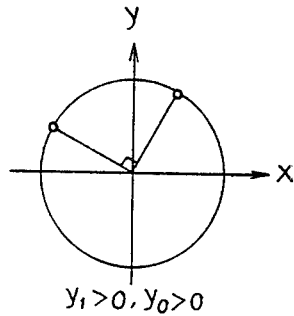
Figure 6C:
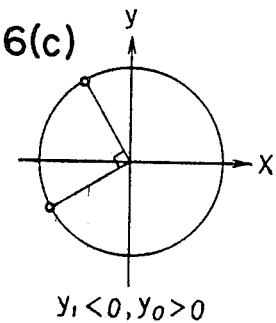
Figure 6D:
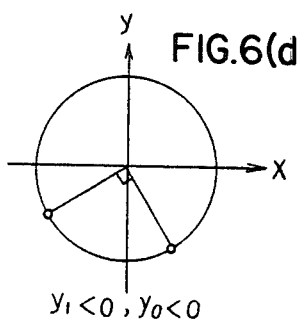

Then considered is the plus and minus signs of the sample values $y_0$ and $y_1$. As shown in FIG. 6, the quadrant where $y_1$ exists can be judged. Namely, in the case of FIG. 6(a), $y_1 > 0$, $y_0 < 0$, and the angle between $y_1$ and $y_0$ is a constant $\pi/2$. Therefore, it is understood that because of the sign relationship of $y_1$ and $y_0$ that $y_1$ exists in the first quadrant. In the case of FIG. 6(b), $y_1 > 0$, $y_0 < 0$ and it is understood for the same reason that $y_1$ exists in the second quadrant. In the case of FIG. 6(c), $y_1 < 0$, $y_0 > 0$, and it is also understood that $y_1$ exists in the third quadrant. In the case of FIG. 6(d), $y_1 < 0$, $y_0 > 0$, and it is further understood that $y_1$ exists in the forth quadrant. Therefore, since it is possible to determine $\phi$ of equation (4) within the range from zero to $\pi/2$ by knowing the signs of $y_1$ and $y_0$; the following equation can be obtained:

$$\phi = \tan^{-1} y_1/y_0 \quad (5)$$

When obtaining a value of $\phi$ from equation (5), the value of $|y_1/y_0|$ can be in the range from zero to infinity ($\infty$).

Therefore, when the absolute values $|y_0|$ and $|y_1|$ of the sample values $y_0$ and $y_1$ are compared, the particular area of the two areas into which a quadrant is divided in which $y_1$ exists can be determined. As a result, as indicated by the hatched areas in FIG. 7(a) and (b), the region in which $y_1$ exists can be determined whenever one quadrant is divided into two areas based on the absolute values.

Figure 7A:
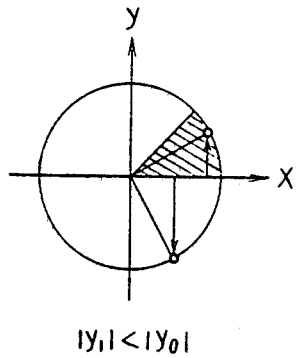
FIGS. 7(a)-7(b) illustrate the positions of $y_0$ and $y_1$ on the phase plane depending on difference between their absolute values.
Figure 7B:
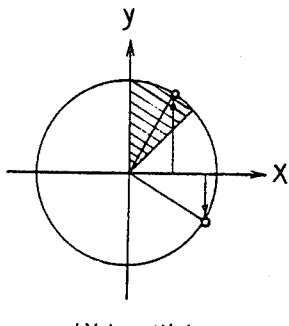

Namely, when $|y_1| < |y_0|$, FIG. 7(a) is effective, or when $|y_1| > |y_0|$, FIG. 7(b) is applicable. Thereby, the particular area location around a phase plane divided equally into eight areas where the timing of sample value $y_1$ exists can be judged solely from the signs of sampled values $y_0$ and $y_1$ and the result of a comparison between the absolute values of the sampled values.

Figure 8:
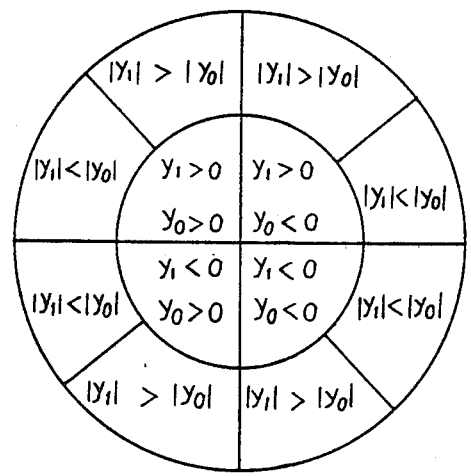

FIG. 8 shows such relationships. In this figure, it is illustrated that if the range on the phase plane is divided equally into eight areas the phase difference can be determined from the result of a comparison between $|y_1|$ and $|y_0|$ and the signs of $y_1$ and $y_0$.

From this fact, it is enough to substantially determine $\phi$ in equation (5) within the range from zero to $\pi/4$ radians corresponding to one of the eight equal areas. Therefore, the value of $|y_1/y_0|$ in the equation (5) may be within the range from 0 to 1. In place of the equation (5) corresponding to FIG. 7(a) and FIG. 7(b), the following equations (6) and (7), where the larger one among $y_0$ and $y_1$ is placed in the denominator while the smaller one is placed in the numerator, are used.

$$\phi_x = \tan^{-1}|y_1/y_0|, \text{ where } |y_1| \leq |y_0| \qquad (6)$$

$$\phi_x = \tan^{-1}|y_0/y_1|, \text{ where } |y_0| \geq |y_1| \qquad (7)$$

The equation (6) indicates an angle formed between the x axis and $y_1$, while the equation (7) an angle formed between the y axis and $y_1$. This is obvious from the relationship, $\tan(\pi/2 - \phi) = 1/\tan\phi$.

From the above explanation, it will be understood that in any area on the phase plane divided equally into eight areas where a phase difference between the signal $f_R$ and the timing of sample value $y_1$ exists, $\phi_x$ and $\phi_y$ in the range from 0 to $\pi/4$ radian can be obtained.

Table 1 shows the phase difference $\phi$ ($\theta = 2\pi - \phi$), with the signal $f_R$ at the timing of sample value $y_1$, the signs of $y_0$ and $y_1$, and the relationship between $|y_0|$ and $|y_1|$.

TABLE 1

| Phase of $y_1$ ($\times$ /4 radian) | Sign $y_0$ | $y_1$ | $|y_0|$ $|y_1|$ | $\phi$ | $\theta = 2\pi - \phi$ |
|---|---|---|---|---|---|
| 0 ~ 1 | − | + | > | $0 + \phi_x$ | $2\pi - \phi_x$ |
| 1 ~ 2 |   |   | < | $\pi/2 - \phi_y$ | $3\pi/2 + \phi_y$ |
| 2 ~ 3 | + | + | < | $\pi/2 + \phi_y$ | $3\pi/2 - \phi_y$ |
| 3 ~ 4 |   |   | > | $\pi - \phi_x$ | $\pi + \phi_x$ |
| 4 ~ 5 | + | − | > | $\pi + \phi_x$ | $\pi - \phi_x$ |
| 5 ~ 6 |   |   | < | $3\pi/2 - \phi_y$ | $\pi/2 + \phi_y$ |
| 6 ~ 7 | − | − | < | $3\pi/2 + \phi_y$ | $\pi/2 - \phi_y$ |
| 7 ~ 8 |   |   | > | $2\pi - \phi_x$ | $0 + \phi_x$ |

Now an embodiment of the present invention will be explained with reference to FIG. 2 and FIG. 3.

When the sequence controller 3 does not control the counter 63, the counter 63 cyclically counts up from 0 to N. When the contents of counter 63 reaches 3N/4, register 66 stores the signal $f_R$ corresponding to $y_0$ and, when the contents of counter reaches 0, register 67 stores the signal $f_R$ corresponding to $y_1$.

The sample values $y_0$ and $y_1$ of signal $f_R$ are respectively input into the registers 66 and 67 shown in FIG. 2. The sample values $y_0$ and $y_1$ are then input into the calculator 65. A structural example of the calculator 65 is shown in FIG. 3. In FIG. 3, 111 and 112 are absolute value networks; 113 is a comparator or subtractor; 114 and 115 are selectors; 116 is a reciprocate or multiplicative inverse network; 117 is a multiplier; 118 is a ROM (Read Only Memory).

In FIG. 3, the sample values $y_0$ and $y_1$ are respectively converted to the absolute values of $y_0$ and $y_1$ by the absolute value networks 111 and 112. In the digital calculation, such conversion is indicated generally performed by 2's complement, and therefore it indicates that 2's complement is negative when the maximum significant bit (MSB) is 1, or positive when it is 0. The absolute networks 111 and 112 have the same structure. When the MSB of the input signal is 1, these circuits respectively invert the bit, but when MSB is 0, these circuits output directly without inversion. Thus, approximated absolute values $|y_0|$ and $|y_1|$ are obtained as the outputs of absolute networks 111 and 112. The absolute values $|y_0|$ and $|y_1|$ are input into the subtractor 113, making its output logic "1" when $|y_0| - |y_1| \geq 0$ or logic "0" when $|y_0| - |y_1| < 0$. The selector 114 passes therethrough respectively the output $|y_1|$ of the absolute value network 112 or the output $|y_0|$ of the absolute value network 111, according to the output, logic "1" or logic "0" of the subtractor 113. On the contrary, the selector 115 passes therethrough respectively the output $|y_0|$ of the absolute value network 111 or the output $|y_1|$ of the absolute value network 112, according to the output, logic "1" or logic "0" of the subtractor 113. The reciprocate or inverse network 116 connected to the output of selector 115 is composed of a ROM (Read Only Memory) and outputs the reciprocal of the numbers output by the selector 115. The multiplier 117 multiplies the output of the selector 114 and the output of the reciprocate network 116. As an output of the multiplier, the value $|y_1/y_0|$ or $|y_0/y_1|$ within the range from 0 to 1 can be obtained. The sign bits of $y_0$ and $y_1$, an output sign bit of subtractor 113 and an output of multiplier are respectively input into the Read Only Memory ROM 118. This ROM 118 is stores the conversion table. The ROM 118 is divided into eight areas according to three factors, that is the sign bits of $y_0$, $y_1$ and an output of subtractor 113, and each part corresponds to any of eight phases of $y_1$ as shown in the TABLE 1. Moveover, each part is sorted and addressed according to an output of the multiplier 117. This is shown in TABLE 2.

In Table 2 (A) PHASE of $y_1$ in the left column corresponds to TABLE 1. The (B) column indicates the signs of sample values $y_1$ and $y_0$, the column (C) indicates the sign of $|y_0| - |y_1|$, the (D) column indicates the value of $|y_0|/|y_1|$ or $|y_1|/|y_0|$ and the column (E) indicates the value into be set to the counter 63.

TABLE 2

| (A) PHASE OF $y_1$ ($\times \pi/4$ radian) | (B) sign ($y_0$) | (B) sign ($y_1$) | (C) sign ($|y_0| - |y_1|$) | (D) $\frac{|y_0|}{|y_1|}$ or $\frac{|y_1|}{|y_0|}$ | | | | | | | | (E) ROUND$\left(\frac{\phi N}{2\pi}\right)$ N = 256 ROM DATA binary | | | | | | | | decimal |
|---|---|---|---|---|---|---|---|---|---|---|---|---|---|---|---|---|---|---|---|---|
| | 10 | 9 | 8 | 7 | 6 | 5 | 4 | 3 | 2 | 1 | 0 | 7 | 6 | 5 | 4 | 3 | 2 | 1 | 0 | |
| | 1 | 0 | 0 | 0 | 0 | 0 | 0 | 0 | 0 | 0 | 0 | 0 | 0 | 0 | 0 | 0 | 0 | 0 | 0 | 0 |
| | 1 | 0 | 0 | 0 | 0 | 0 | 0 | 0 | 0 | 0 | 1 | 0 | 0 | 0 | 0 | 0 | 0 | 0 | 1 | 1 |
| 0 ~ 1 | ⋮ | | ⋮ | | | | | ⋮ | | | | | | | ⋮ | | | | | ⋮ |
| | 1 | 0 | 0 | 0 | 1 | 1 | 1 | 1 | 1 | 1 | 1 | 0 | 0 | 0 | 1 | 1 | 1 | 1 | 1 | 31 |
| | 1 | 0 | 0 | 1 | 0 | 0 | 0 | 0 | 0 | 0 | 0 | 0 | 0 | 1 | 0 | 0 | 0 | 0 | 0 | 32 |
| | 1 | 1 | 1 | 0 | 0 | 0 | 0 | 0 | 0 | 0 | 0 | 0 | 1 | 0 | 0 | 0 | 0 | 0 | 0 | 64 |
| 1 ~ 2 | ⋮ | | ⋮ | | | | | ⋮ | | | | | | | ⋮ | | | | | ⋮ |
| | 1 | 1 | 1 | 1 | 0 | 0 | 0 | 0 | 0 | 0 | 0 | 0 | 0 | 1 | 0 | 0 | 0 | 0 | 0 | 32 |
| | 0 | 1 | 1 | 0 | 0 | 0 | 0 | 0 | 0 | 0 | 0 | 0 | 1 | 0 | 0 | 0 | 0 | 0 | 0 | 64 |
| 2 ~ 3 | ⋮ | | ⋮ | | | | | ⋮ | | | | | | | ⋮ | | | | | ⋮ |
| | 0 | 1 | 1 | 0 | 0 | 0 | 0 | 0 | 0 | 0 | 0 | 0 | 1 | 1 | 0 | 0 | 0 | 0 | 0 | 96 |
| | 0 | 0 | 0 | 0 | 0 | 0 | 0 | 0 | 0 | 0 | 0 | 1 | 0 | 0 | 0 | 0 | 0 | 0 | 0 | 128 |

TABLE 2-continued

| (A) PHASE OF y₁ (× π/4 radian) | (B) sign (y₀) | (B) sign (y₁) | (C) sign (\|y₀\| − \|y₁\|) ROM ADDRESS | (D) $\frac{\|y_0\|}{\|y_1\|}$ or $\frac{\|y_1\|}{\|y_0\|}$ | | | | | | | | (E) ROUND$\left(\frac{\phi N}{2\pi}\right)$ N = 256 ROM DATA binary | | | | | | | | decimal |
|---|---|---|---|---|---|---|---|---|---|---|---|---|---|---|---|---|---|---|---|---|
| | 10 | 9 | 8 | 7 | 6 | 5 | 4 | 3 | 2 | 1 | 0 | 7 | 6 | 5 | 4 | 3 | 2 | 1 | 0 | |
| 3 ~ 4 | ≀ | | ≀ | | | | ≀ | | | | | | | | ≀ | | | | | ≀ |
| | 0 | 0 | 0 | 1 | 0 | 0 | 0 | 0 | 0 | 0 | 0 | 0 | 1 | 1 | 0 | 0 | 0 | 0 | 0 | 96 |
| | 0 | 1 | 0 | 0 | 0 | 0 | 0 | 0 | 0 | 0 | 0 | 1 | 0 | 0 | 0 | 0 | 0 | 0 | 0 | 128 |
| 4 ~ 5 | ≀ | | ≀ | | | | ≀ | | | | | | | | ≀ | | | | | ≀ |
| | 0 | 1 | 0 | 1 | 0 | 0 | 0 | 0 | 0 | 0 | 0 | 1 | 0 | 1 | 0 | 0 | 0 | 0 | 0 | 160 |
| | 0 | 1 | 1 | 0 | 0 | 0 | 0 | 0 | 0 | 0 | 0 | 1 | 1 | 0 | 0 | 0 | 0 | 0 | 0 | 192 |
| 5 ~ 6 | | | ≀ | | | | ≀ | | | | | | | | ≀ | | | | | ≀ |
| | 0 | 1 | 1 | 1 | 0 | 0 | 0 | 0 | 0 | 0 | 0 | 1 | 0 | 1 | 0 | 0 | 0 | 0 | 0 | 160 |
| | 1 | 1 | 1 | 0 | 0 | 0 | 0 | 0 | 0 | 0 | 0 | 1 | 1 | 0 | 0 | 0 | 0 | 0 | 0 | 192 |
| 6 ~ 7 | ≀ | | ≀ | | | | ≀ | | | | | | | | ≀ | | | | | ≀ |
| | 1 | 1 | 1 | 1 | 0 | 0 | 0 | 0 | 0 | 0 | 0 | 1 | 1 | 1 | 0 | 0 | 0 | 0 | 0 | 224 |
| | 1 | 1 | 0 | 0 | 0 | 0 | 0 | 0 | 0 | 0 | 0 | 0 | 0 | 0 | 0 | 0 | 0 | 0 | 0 | 256 (0) |
| 7 ~ 8 | ≀ | | ≀ | | | | ≀ | | | | | | | | ≀ | | | | | ≀ |
| | 1 | 1 | 0 | 1 | 0 | 0 | 0 | 0 | 0 | 0 | 0 | 1 | 1 | 1 | 0 | 0 | 0 | 0 | 0 | 224 |

In TABLE 2, ROM ADDRESS is an input to ROM 118. ROM ADDRESS columns "9" and "10" respectively correspond to the sign bits of the output of registers 66 or 67, while ROM ADDRESS column "8" corresponds to an output sign bit of the substractor 113, ROM ADDRESS columns "0" to "7" corresponds from the multiplier 117.

When the specified ROM ADDRESS is input, the corresponding ROM DATA of the (E) column is output. The ROM DATA is output as the binary bits with the corresponding decimal convesion indicated in the "decimal" column.

When an output of ROM 118 is input into the initial value-set-terminal S of the counter 63 shown in FIG. 2, these sequence controller 3 shown in FIG. 1 controls the counter 63. Thereby, the output of ROM 118 is loaded into the counter 63. Thus, the initial phase pull-in is carried out between the signal $f_R$ and the output signal of digital phase locked loop (CL).

Figure 9:
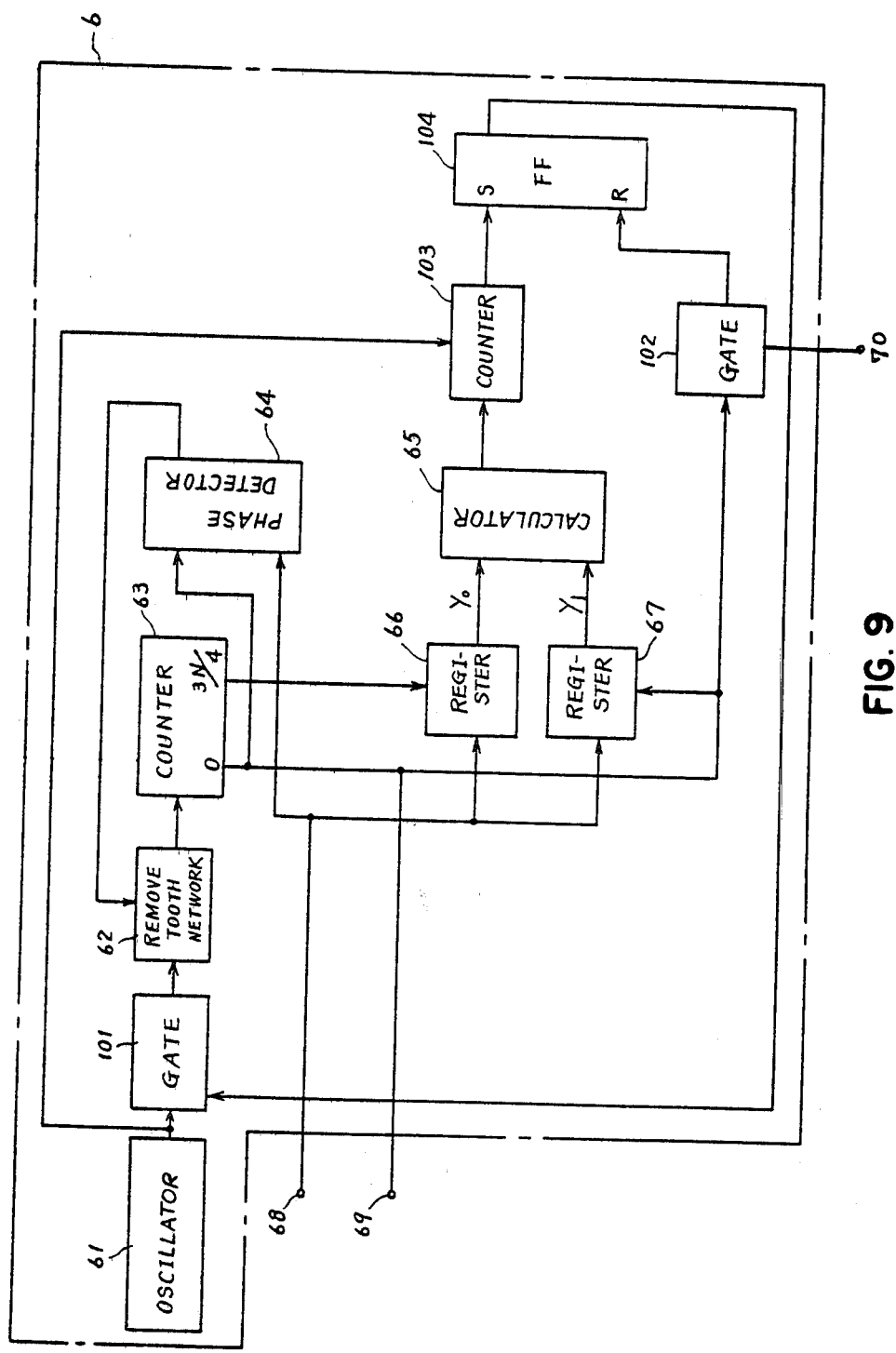
FIG. 9 illustrates another embodiment of the present invention.

FIG. 9 shows another embodiment of the present invention. In this embodiment, the oscillator 61, remove tooth network 62, counter 63, phase detector 64, calculator 65, registers 66 and 67, terminals 68 and 69 are similar to those of the embodiment shown in FIG. 2.

The embodiment shown in this figure is different from that shown in FIG. 2 in that the gates 101 and 102, the 2nd counter 103 and flip-flop 104 are added to the embodiment shown in FIG. 2. The operation of the embodiment shown in 9 is similar to that of embodiment shown in FIG. 2 until the process when the sample values $y_0$ and $y_1$ are input to the registers 66 and 67. When digital phase locked loop is freely running without a received signal, gate 102 closes, flip-flop 104 outputs logic "1" and gate 101 opens.

In this embodiment, the following operation is carried out for the initial phase pull-in by for stopping the operation of the counter 63 for the time period $\theta/2\pi f_R$ corresponding to the supplementary angle $\theta$ ($\theta$ indicated in the TABLE 1) of phase $\phi$ at the timing of the sample value $y_1$, namely the count value $N\theta/2\pi$ corresponding to $\theta$. When the contents of counter 63 becomes 0, and the sequence countroller 3 shown in the FIG. 1 controls the gate 102, and the gate 102 opens, making an output of the flip-flop 104 logic "0". As a result, the gate 101 closes and the remove tooth network 62 and counter 63 stop the operation. Meanwhile, a value of $\theta N/2\pi$ is obtained at the calculator 65 based on the contents $y_0$ and $y_1$ of the registers 66, 67 and this value N/2 is set into the down counter 103. The counter 103 performs a decrement operation based on the clock signal or pulses sent from the oscillator 61. When contents of counter 103 becomes zero, an output of the flip-flop 104 is set to logic "1" and the gate 101 opens. As a result, the counter 63 starts operation. Thereafter, the ordinary operation explained with respect to the embodiment of FIG. 2 is carried out.

In the explanation of operation for the embodiments of FIG. 2 and FIG. 9, the calculation time for obtaining the phase angle $\phi$ and the supplementary angle $\theta$ is ignored. If such calculation time cannot be ignored, it is necessary to include a phase shift corresponding to such calculation time into $\phi$ and $\theta$.

As explained previously, a phase difference between the input single frequency signal extracted from a received signal and the output signal of the digital phase locked loop can be obtained with a simplified structure by adopting the present invention, and moreover a high speed phase pull-in can be realized by setting the initial set value of the counter in the phase locked loop in accordance with the obtained initial phase difference. Therefore the circuit structure can be simplified and simultaneously the time required for synchronization can be drastically curtailed.

In the above explanation, it is desirable that the sampling frequency be 4 times that the single frequency signal $f_R$, but a phase difference with an accuracy of $2\pi/2n$ radians can also be obtained from the signs of the sampled values and the relationship between absolute values of the sampled values for a freely selected n samples. Thus, a detailed phase difference can be obtained by using the following equation when the sampled values i and j are respectively considered as $y_i$ and $y_j$.

$$\tan^{-1}\frac{y_i \sin\frac{2\pi}{n}(j-i)}{y_j - y_i \cos\frac{2\pi}{n}(j-i)}$$

The present invention can generally be connected to a system which realizes phase pull-in for the reference clock when the input signal is the single frequency signal, and for example, the present invention can be connected to a data modem etc.

We claim:

1. A fast pull-in digital phase locked loop circuit which obtains a phase difference between a single frequency signal and an output signal of said digital phase locked loop which is obtained by dividing a specified frequency with a dividing counter, comprising:

a sample circuit which obtains two sample values of said single frequency signal at two points based on said output signal of said digital phase locked loop corresponding to a phase difference of $\pi/2$ radians of said single frequency signal, said two sample values each having a sign;

a comparator circuit, operatively connected to said sample circuit, which determines a relationship of the absolute values of said two sample values;

an amplitude ratio circuit, operatively connected to said sample circuit, which obtains an amplitude ratio of said two sample values;

conversion means, operatively connected to said sample circuit, said comparator circuit, said amplitude ratio circuit and said dividing counter, for obtaining an initial value corresponding to said phase difference from the sign of said two sample values, the relationship determined by said comparator circuit and the amplitude ratio produced by said amplitude ratio circuit, and the initial value being set into said dividing counter; and pulse means, operatively connected to said dividing counter, for producing pulses in dependence upon a phase difference between said output signal and said single frequency signal.

2. A fast pull-in digital phase locked loop circuit as set forth in claim 1, wherein said comparator circuit comprises:

an absolute value network, operatively connected to said sample circuit, which obtains the respective absolute values of said two sample values; and a subtractor, operatively connected to said absolute value network, which obtains a difference between the two absolute values produced by said absolute value network.

3. A fast pull-in digital phase locked loop circuit as set forth in claim 2, wherein said amplitude ratio circuit comprises:

a selector, operatively connected to said absolute value network and said subtractor, and having first and second paths, which selectively connects the two outputs of said absolute value network to the first or second path in dependence upon the difference produced by said subtractor;

a reciprocate network, operatively connected to said second path, which obtains a reciprocal of the absolute value received by the second path; and a multiplier, operatively connected to the first path and said reciprocate network, to which the signals sent from said first and second paths are input.

4. A fast pull-in digital phase locked loop circuit as set forth in claim 1, wherein said pulse means comprises:

an oscillator outputting pulses at the specified frequency;

a phase detector, operatively connected to said dividing counter, which inputs said output signal from said digital phase locked loop and said single frequency signal and detects a phase difference between these signals; and a remove tooth network, operatively connected to said oscillator, said dividing counter and said phase detector, which thins the output pulses of the oscillator outputting said specified frequency signal in accordance with the phase difference produced by said phase detector.

5. A fast pull-in digital phase locked loop circuit which obtains a phase difference between a single frequency signal and an output signal of said digital phase locked loop which is obtained by dividing the specified frequency with a dividing counter and pulls in the phase synchronization, comprising:

a sample circuit which obtains two sample values of said single frequency signal at two points based on said output signal of said digital phase locked loop corresponding to a phase difference of $\pi/2$ radians of said single frequency signal, said two sample values each having a sign;

a comparator circuit, operatively connected to said sample circuit, which obtains the relationship between absolute values of said two sample values;

an amplitude ratio circuit, operatively connected to said sample circuit, which obtains an amplitude ratio of said two sampled values;

conversion means, operatively connected to said sample circuit, said comparator circuit, said amplitude ratio circuit and said dividing counter, for obtaining a value corresponding to a supplementary angle of said phase difference from the signs of said two sample values, the relationship produced by said comparator circuit and the amplitude ratio produced by said amplitude ratio circuit, and said dividing counter stops operation for a period corresponding to said supplementary angle in accordance with the supplementary angle produced by said conversion table; and pulse means, operatively connected to said dividing counter, for producing pulses in dependence upon a phase difference between said output signal and said single frequency signal.

6. A fast pull-in digital phase locked loop circuit as set forth in claim 5, wherein said comparator circuit comprises:

an absolute value network, operatively connected to said sample circuit, which takes respective absolute values of said two sample values; and a subtractor, operatively connected to said absolute value network, which obtains a difference between the absolute values produced by said absolute value network.

7. A fast pull-in digital phase locked loop circuit as set forth in claim 6, wherein said amplitude ratio circuit comprises:

a selector, operatively connected to said absolute value network and said subtractor and having first and second paths, which selectively passes the outputs of said absolute value network to the first or second path in dependence upon the difference produced by said subtractor;

a reciprocate network, operatively connected to the second path, which obtains a reciprocal of the absolute value received by the second path; and a multiplier, operatively connected to the first path and said reciprocate network, which inputs the signals sent from said first and second paths.

8. A fast pull-in digital phase locked loop circuit as set forth in claim 5, wherein said pulse means comprises:

an oscillator outputting pulses of a specified frequency;

a phase detector, operatively connected to said dividing counter, which inputs both said output signal from said digital phase locked loop and said single frequency signal and detects a phase difference between these signals; and a remove tooth network, operatively connected to said oscillator, said dividing counter and said phase detector, which thins the output pulses from the oscillator which outputs said specified frequency signal, in accordance with the difference produced by said phase detector.

9. A fast pull-in digital phase locked loop circuit as set forth in claim 8, further comprising:

a down counter, operatively connected to said conversion table and said oscillator, which initially receives a value corresponding to said supplementary angle and counts down;

a first gate, operatively connected to said down counter, said oscillator and said remove tooth network, which opens when the count of said down counter becomes zero and a second gate, operatively connected to said dividing counter and said first gate, which opens when the count of said dividing counter becomes zero.

10. A digital phase locked loop circuit operatively connectable to receive a start signal and a single frequency signal which is a digital representation of an analog single frequency signal and for generating a reference timing signal, comprising:

clock means for generating a reference clock signal;

pulse means, operatively connected to said clock means, for generating clock pulses in dependance upon the reference clock signal;

count means, operatively connectable to receive the start signal and operatively connected to said pulse means, for counting the clock pulses under the control of the start signal and for generating the reference timing signal and a control signal in dependence upon the count;

storage means, operatively connected to receive the single frequency signal and operatively connected to said count means, for storing first and second values of the single frequency signal in dependence upon the reference timing signal and the control signal;

phase detection means, operatively connected to said count means and operatively connectable to receive the single frequency signal, for detecting a phase difference between the reference timing signal and the single frequency signal and for generating an inhibit signal in dependence upon the phase difference, the inhibit signal controlling said pulse means to inhibit the generation of the clock pulses and calculation means, operatively connected to said storage means and said count means, for determining the sign of said first and second values, for dividing the smaller of the first and second values by the larger of the first and second values and for generating a count value from the determining, comparing and dividing, the count value being input into said count means in dependence upon said start signal.

11. A digital phase locked loop circuit operatively connectable to receive a start signal and a single frequency signal which is a digital representation of an analog single frequency signal and for generating a reference timing signal, comprising:

clock means for generating a reference clock signal;

gate means, operatively connected to said clock means, for passing therethrough the reference clock signal;

pulse means, operatively connected to said gate means, for generating clock pulses in dependance upon the reference clock signal;

first count means, operatively connected to said pulse means, for counting the clock pulses and for generating the reference timing signal and a control signal in dependence upon the count;

storage means, operatively connectable to receive the single frequency signal and operatively connected to said count means, for storing first and second values of the single frequency signal in dependence the reference timing signal and the control signal;

phase detection means, operatively connected to said first count means and operatively connectable to receive the single frequency signal, for detecting a phase difference between the reference timing signal and the single frequency signal and for generating an inhibit signal in dependence upon the phase difference, the inhibit signal controlling said pulse means to inhibit the generation of the clock pulses;

calculation means, operatively connected to said storage means, for comparing the absolute values of said first and second values, for dividing the smaller of the first and second values by the larger of the first and second values and for generating a count value from the determining, comparing and dividing;

second count means, operatively connected to said calculation means and said clock means, for counting down from the count value in dependence upon the reference clock signal;

second gate means, operatively connectable to receive the start signal and operatively connected to said first count means, for passing therethrough the reference timing signal in dependence upon the start signal; and gate control means, operatively connected to said second count means, said second gate means, and said first gate means, for controlling said first gate means in dependence upon the output of said second count means and said reference timing signal.

12. A digital phase locked loop as set forth in claim 10 or 11, wherein said first and second values have signs, and wherein said calculation means comprises:

absolute value means, operatively connected to said storage means, for generating the absolute values of said first and second values;

subtract means, operatively connected to said absolute value means, for generating a selection signal in dependence upon the absolute value;

selector means, operatively connected to said absolute value means and said subtract means, for selectively outputting the absolute values in dependence upon the selection signal;

inverse means, operatively connected to said selector means, for inverting one of the absolute values;

multiplier means, operatively connected to said selector means and said inverse means, for multiplying the inverted absolute value by the non-inverted absolute value and producing a multiplied value; and memory means, operatively connected to said multiplier means, said subtractor means and said storage means, for outputting the count value in dependence upon the signs of the first and second values, the selection signal and the multiplied value.

* * * * *

UNITED STATES PATENT AND TRADEMARK OFFICE
CERTIFICATE OF CORRECTION

PATENT NO. :   4,445,224                               Page 1 of 4

DATED      :   April 24, 1984

INVENTOR(S):   Kuninosuke Ihira et al

It is certified that error appears in the above-identified patent and that said Letters Patent is hereby corrected as shown below:

Front page, after "Primary Examiner--Benedict V. Safourek", insert the following line
--Attorney, Agent, or Firm -- Staas & Halsey--.

Column 1, line 8,   delete "the";
          line 32,  ")." should be --).--;
          line 38,  ")." should be --).--;
          line 64,  after "based", insert --on--.

Column 2, line 7,   delete "set by";
          line 15,  after "based", insert --on--;
          line 19,  "a" should be --an--;
          line 26,  "it's" should be --its--;
          line 38,  "paths" should be "path--;
          line 46,  "thin" should be --thins--;
          line 54,  "connect 'a' to" should be --connects--;
          line 67,  after "of", first occurrence, insert --the--.

UNITED STATES PATENT AND TRADEMARK OFFICE
CERTIFICATE OF CORRECTION

PATENT NO. : 4,445,224

DATED : April 24, 1984

INVENTOR(S) : Kuninosuke Ihira et al

It is certified that error appears in the above-identified patent and that said Letters Patent is hereby corrected as shown below:

Column 3, line 27, "a", second occurrence, should be --an--;
line 29, "a" should be --an--;
line 30, "a", second occurrence, should be --an--;
line 61, "the", second occurrence, should be --then--.

Column 4, line 36, "(6)" should be --6--;
line 43, "(6)" should be --6--;
line 59, "," should be --;--;
line 62, "resisters" should be --registers--.

Column 5, line 6, "thus," should be --thus--;
line 18, "(6)" should be --6--;
line 60, formula should be numbered --(3)--.

UNITED STATES PATENT AND TRADEMARK OFFICE
CERTIFICATE OF CORRECTION

PATENT NO. : 4,445,224

DATED : April 24, 1984

INVENTOR(S) : Kuninosuke Ihira et al

It is certified that error appears in the above-identified patent and that said Letters Patent is hereby corrected as shown below:

Column 6, line 13, delete "of";
line 17, after "of", first occurrence, insert --the--;
line 24, after "$y_0$", insert --,--;
line 50, "effective" should be --applicable--.

Column 7, line 6, "$\geq$" should be --$\leq$--;
line 8, after "(7)", insert --indicates--.

Column 8, line 36, delete "is";
line 48, "into" should be --to--; "to" should be --into--.

Column 9, line 29, before "from", insert --to an output--;

line 37, "these" should be --the--;

line 51, after "in", insert --FIG.--.

Column 10, line 38, "into" should be --in--;
line 47, insert "," after --Therefore--;
line 63, formula should be numbered --(8)--.

UNITED STATES PATENT AND TRADEMARK OFFICE
CERTIFICATE OF CORRECTION

PATENT NO. : 4,445,224

DATED : April 24, 1984

INVENTOR(S) : Kuninosuke Ihira et al

It is certified that error appears in the above-identified patent and that said Letters Patent is hereby corrected as shown below:

```
Column 13, line 22,   after "zero", insert --;--;
           line 53,   after "pulses", insert --;--.
```

Signed and Sealed this

Fifteenth Day of January 1985

[SEAL]

Attest:

GERALD J. MOSSINGHOFF

Attesting Officer

Commissioner of Patents and Trademarks